(12) United States Patent
Roesner et al.

(10) Patent No.: US 10,643,917 B2
(45) Date of Patent: May 5, 2020

(54) MAGNETIC PHASE CHANGE MATERIAL FOR HEAT DISSIPATION

(71) Applicant: Infineon Technologies AG, Neubiberg (DE)

(72) Inventors: Michael Roesner, Villach (AT); Christoph Bergmann, Villach (AT)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 16/138,697

(22) Filed: Sep. 21, 2018

(65) Prior Publication Data
US 2019/0096780 A1 Mar. 28, 2019

(30) Foreign Application Priority Data
Sep. 22, 2017 (DE) .......... 10 2017 122 053

(51) Int. Cl.

| | | |
|---|---|---|
| H01L 23/34 | (2006.01) | |
| H01L 21/44 | (2006.01) | |
| H01L 21/48 | (2006.01) | |
| H01L 21/50 | (2006.01) | |
| H01L 23/29 | (2006.01) | |
| H01L 23/427 | (2006.01) | |
| H01L 23/433 | (2006.01) | |
| H01L 43/02 | (2006.01) | |
| H01L 43/10 | (2006.01) | |
| H01L 23/31 | (2006.01) | |

(52) U.S. Cl.
CPC .......... *H01L 23/34* (2013.01); *H01L 23/29* (2013.01); *H01L 23/295* (2013.01); *H01L 23/427* (2013.01); *H01L 23/4334* (2013.01); *H01L 43/02* (2013.01); *H01L 43/10* (2013.01); *H01L 23/3107* (2013.01); *H01L 2224/16225* (2013.01); *H01L 2224/32225* (2013.01); *H01L 2224/48227* (2013.01); *H01L 2224/48247* (2013.01); *H01L 2224/73265* (2013.01)

(58) Field of Classification Search
CPC ....... H01L 23/34; H01L 23/29; H01L 23/295; H01L 23/427; H01L 23/4334; H01L 43/02; H01L 43/10
USPC .......................................... 257/712; 438/122
See application file for complete search history.

(56) References Cited

U.S. PATENT DOCUMENTS

| | | | |
|---|---|---|---|
| 9,984,745 B2 * | 5/2018 | Tominaga | H01L 43/08 |
| 10,090,460 B2 * | 10/2018 | Saito | G11C 11/161 |
| 2008/0164603 A1 | 7/2008 | Sturcken et al. | |
| 2009/0080124 A1 | 3/2009 | Yoshikawa et al. | |

(Continued)

FOREIGN PATENT DOCUMENTS

| | | |
|---|---|---|
| DE | 112008000371 T5 | 12/2009 |
| EP | 3001470 A1 | 3/2016 |
| JP | 2017065984 A | 4/2017 |

*Primary Examiner* — David S Blum
(74) *Attorney, Agent, or Firm* — Murphy, Bilak & Homiller, PLLC

(57) ABSTRACT

An electronic component includes an electronic chip and a magnetic phase change material configured to consume energy when changing between different magnetic phases in response to heating above a phase change temperature. The phase change material is thermally coupled with the electronic chip to thereby dissipate heat from the electronic chip upon heating up to or above the phase change temperature.

24 Claims, 4 Drawing Sheets

(56) References Cited

U.S. PATENT DOCUMENTS

2011/0012082 A1* 1/2011 Tio Castro .............. H01L 45/06
  257/2
2016/0156213 A1 6/2016 Yajima et al.

* cited by examiner

MAGNETIC PHASE CHANGE MATERIAL FOR HEAT DISSIPATION

TECHNICAL FIELD

Various embodiments relate generally to an electronic component, an operation method, and a method of use.

BACKGROUND

Conventional encapsulant materials, such as mold structures, for electronic components and in particular electronic chips have evolved to a level where the package no longer significantly impedes the performance of the components. Encapsulating electronic components during package manufacture may protect them against the environment. It is also common to use non-encapsulated packages or even naked dies for various electronic applications.

However, there is still potentially room to reduce manufacturing cost and simplify processing while improving the thermal performance. Also, a proper mechanical reliability is desired.

SUMMARY

There may be a need for an electronic component with efficient heat dissipation and proper mechanical reliability.

According to an exemplary embodiment, an electronic component is provided which comprises an electronic chip, and a magnetic phase change material configured for consuming energy when changing between different magnetic phases (such as different magnetic ordering states) in response to heating up to or above a phase change temperature, wherein the phase change material is thermally coupled with the electronic chip to thereby dissipate heat from the electronic chip upon heating up to or above the phase change temperature (in particular by melting a magnetically ordered state at the phase change temperature or transition temperature).

According to another exemplary embodiment, a method is provided which comprises providing an electronic chip being thermally coupled with a magnetic phase change material. This material is configured for consuming energy when changing between different magnetic phases in response to heating up to or above a phase change temperature. The method further comprises operating the electronic chip and thereby generating heat which heats the phase change material up to or above the phase change temperature to thereby dissipate heat from the electronic chip by the phase change.

According to another exemplary embodiment, a magnetic phase change material, which consumes energy when changing its magnetic phase in response to heating, is used for temperature stabilization.

According to an exemplary embodiment, a phase change material is thermally coupled to an electronic chip. The phase change material may be of the type which consumes energy when changing phase in response to heating up to or above a phase change temperature. Thus, when the electronic chip is heated or even overheated so that the local temperature of the electronic chip becomes high or even critical, the phase change of the phase change material will automatically occur and will take away the energy required for this phase change from the heated electronic chip. Thereby, an automatic and highly efficient heat dissipation away from the electronic chip can be achieved which advantageously acts at a locally precisely definable position, i.e. the position of the phase change material. Therefore, the phase change material can be placed close to one or more thermally critical regions of an electronic component, for instance one or more expected or known hot spots, for obtaining a highly efficient temperature stabilization feature. An advantage of exemplary embodiments is that the phase transition may substantially only effect electrons at the Fermi edge and has nearly no effect on the lattice parameters of the phase change material (for instance an alloy). Thus, an undesired production of significant mechanical stress leading to warpage of the electronic component or a part thereof, for instance a wafer and/or a chip, may be advantageously avoided.

Particular advantages may be obtained when the phase change material is a magnetic material and the phase change is a change from one magnetic phase to another magnetic phase: When a magnetic phase change material undergoes a magnetic phase transition, its crystalline structure does not necessarily change significantly. This may include the ordering of the moments of magnetics ions as well as the moments of localized electrons or the itinerant magnetism of electrons in the band structure as function of their spin. But advantageously this often has only a minor effect on the lattice parameters of the material. As a result, the density of the magnetic phase change material does not change or at least does not change significantly when the magnetic phase change occurs. Consequently, the electronic chip and possible other constituents of the electronic component do not suffer from high mechanical stress during the phase change as a consequence of a sudden change of density. Therefore, the implementation of a magnetic phase change material promoting removal of heat from the electronic chip simultaneously guarantees mechanical integrity of the electronic component. At the same time, the thickness of the magnetic phase change material may be kept low which further reduces mechanical load acting on the electronic component.

Moreover, due to the finite recovery time of the magnetic (in particular antiferromagnetic)) ordering, the switching frequency is limited so that a corresponding exemplary embodiment is ideally suited in particular for applications with very high thermal load during switching and low switching frequency, for example for linear mode applications (in particular switching between two power sources).

In the following, further exemplary embodiments of the electronic component, and the methods will be explained.

In the context of the present application, the term "electronic component" may in particular denote any member or device implementing at least one electronic chip which generates heat during operation.

In the context of the present application, the term "electronic chip" may in particular denote a naked die or an encapsulated semiconductor chip fulfilling an electronic function. For instance, the electronic chip is a semiconductor chip, in particular a power semiconductor chip.

In the context of the present application, the term "phase change material" may in particular denote a material which changes its phase (preferably by a first order phase transition) depending on temperature. In particular, such a phase change material may remain solid, but can be in different magnetic ordering states at different temperatures. Although phase change materials remaining solid upon changing their phase triggered by a temperature change are preferred, other embodiments may also implement phase change materials changing the phase for example from solid to liquid and thereby consuming energy required for destroying an ordering state being present below and being lost above the phase transition temperature.

In the context of the present application, the term "magnetic phase change material" may in particular denote a material which changes its magnetic phase (preferably by a first order phase transition) depending on temperature. For example, different magnetic phases are a ferromagnetic phase, a ferrimagnetic phase, an antiferromagnetic phase, a paramagnetic phase, and a diamagnetic phase as well as no magnetic ordering at all. Descriptively speaking, a magnetic phase change material may lose a magnetic ordering scheme above a phase transition temperature. This loss of order requires a certain energy, which is consumed and is taken from the environment when the magnetic phase change material is heated at its phase transition temperature. According to an exemplary embodiment, this may advantageously stop the temperature raise until the phase transition is fully performed.

In the context of the present application, the term "thermally coupled" may in particular denote that the electronic chip and the phase change material are coupled in such a way that heat transfer (in particular heat conduction) between chip and phase change material is enabled. For instance, a direct physical contact between electronic chip and phase change material may be established for this purpose.

For instance, highly appropriate materials for the phase change material are Heusler compounds (like CuMnAs), nickel, and/or a ferrofluid. Two or more of the mentioned materials may be combined. Heusler compounds may be denoted as magnetic intermetallics with face-centered cubic crystal structure and a composition of XYZ (half-Heuslers) or $X_2YZ$ (full-Heuslers), where X and Y are transition metals (such as Cu, Mn, Ni, Co, Fe) and Z is from the p-block (such as As, In, Sn, Sb, Ga). A ferrofluid may be a suspension of small ferromagnetic particles within a protective shell (for instance a polymer, preferably a high temperature stable polymer such as polyimide). Other magnetic materials can be implemented as well provided that they show a magnetic phase transition which consumes energy when heating through the phase transition temperature. Preferably, the phase change material is a CuMnAs alloy. However, other phase change material may also qualify for chip temperature stabilization by thermally triggered heat dissipation, in particular as metal contact with integrated cooling function.

In an embodiment, the phase change material is a magnetic phase change material configured for changing between two non-ferromagnetic phases. In particular, one of the non-ferromagnetic phases may be an antiferromagnetic phase. The other non-ferromagnetic phase may be a paramagnetic phase. When one of the two involved magnetic phases is an antiferromagnetic phase (rather than a ferromagnetic phase) no voltage peaks are generated by the phase change material in view of induction effects during operation of the electronic component. In other words, a magnetic phase change material in an antiferromagnetic phase itself does not generate a macroscopic magnetic field, which might disturb the electronic functionality of the electronic component. Also a paramagnetic phase is advantageous, since it reinforces an external magnetic field only slightly and is therefore significantly less disturbing for the electronic functionality of the electronic component than a pronounced ferromagnetic influence.

However, in other embodiments in which the impact of the magnetic field generated by the phase change material itself is not disturbing, also a magnetic phase change material with a ferromagnetic phase can be implemented.

Descriptively speaking, the re-arrangement of magnetic moments involved in the temperature triggered phase change of magnetic phase change materials may require energy which is taken from the environment. This environment may be defined by or may include the electronic chip which is thereby thermally relaxed by dissipation of heat triggering the phase change and being dissipated thereby. Thus, exemplary embodiments use one or more phase change materials (like for example CuMnAs) which offer preferably an antiferromagnetic-to-paramagnetic phase transition for increase of heat capacity and for temperature stabilization purposes.

In an embodiment, the phase change material is an electrically conductive material. In particular, such a phase change material may be configured advantageously as a metal contact with integrated cooling function. In such an embodiment, the phase change material may simultaneously also fulfill an electronic function, for instance supplying an electric signal or electric power to the electronic chip, and/or from the electronic chip to an electronic periphery.

In an embodiment, the phase change material extends from the electronic chip up to an exterior surface of the electronic component. In such an embodiment, the phase change material may not only stabilize temperature of the electronic chip during phase change, but may also conduct electricity and/or thermal energy from the electronic chip to the exterior surface of the electronic component.

In an embodiment, the phase change material forms at least part of a chip metallization, in particular at least one of a front end of the line (FEOL) metallization and a back end of the line (BEOL) chip metallization. The front-end-of-line (FEOL) may be denoted as the first portion of integrated circuit fabrication where the individual devices (transistors, capacitors, resistors, etc.) are patterned in the semiconductor. FEOL generally covers everything up to (but not including) the deposition of metal interconnect layers. The back end of line (BEOL) may be denoted as the second portion of an integrated circuit fabrication where the individual devices (transistors, capacitors, resistors, etc.) get interconnected with wiring on the wafer, the metallization layer. BEOL generally begins when the first layer of metal is deposited on the wafer. BEOL includes contacts, insulating layers, metal levels, and bonding sites for chip-to-package connections.

For example, the electronic chip may be a transistor chip (more specifically a field effect transistor chip) implementing a transistor function. For example, a source pad and a gate pad may be located on a first main surface (which may also be denoted as front side) of the electronic chip, whereas a drain pad may be located on an opposing other main surface (which may also be denoted as back side) of the electronic chip. In particular the back side (but additionally or alternatively also the front side) may be provided with the magnetic phase change material according to a preferred embodiment. Such an electronic device may undergo a vertical current flow during operation, and may hereby generate ohmic heat.

In an embodiment, an intermediate layer (which may be a single layer or a stack of multiple layers) may be provided between semiconductor material of the electronic chip on the one hand and the phase change material on the other hand. For instance, such an intermediate layer may be a seed layer. Such an intermediate layer may improve adhesion between the semiconductor (in particular silicon) material of the electronic chip on the one hand and the magnetic phase change material on the other hand. For instance, such a seed layer may comprise a titanium layer (for instance having a thickness of 200 nm) directly on (preferably roughened) silicon or other semiconductor material of the electronic chip. Moreover, such a seed layer may comprise an additional copper layer (for instance having a thickness of 300 nm and serving as a passivation layer) on the titanium layer and serving as a base for the magnetic phase change material. The latter can for instance be deposited by techniques like e.g. evaporation, sputtering, molecular beam epitaxy, electrochemical deposition etc. on this copper layer. Also, other intermediate layers or layer stacks are possible, for instance one of the following: Al—Ti—Ag, Al—Ti—Ni—Ti—Ag, Al—Ti—TiN—Ti—Ni—Ti—Ag, Al—Ti—NiV—Ag, Ti—NiV—Ag, Ti—AuSn, Al—Ti—AuSn, Al—Ti—NiV—AuSn.

In an embodiment, the phase change material is configured so that a change of density of the phase change material during phase change is less than 10%, in particular is less than 5%. This property of many magnetic phase change materials, which experience a pronounced change in the electron shell (being predominantly responsible for the magnetic behavior) or a splitting of the bands in spin up and down band, going along with an energy gain that stabilizes the itinerant ordered state, but not so much in the crystalline lattice during changing its phase, is highly advantageous to keep mechanical stress inside the electronic component small.

In an embodiment, the phase change material is configured so that the phase change temperature is in a range between −100° C. and 700° C., in particular in a range between 50° C. and 200° C. In embodiments, in which power packages in silicon carbide technology are implemented, a phase change in a range between 50° C. and 700° C. may be relevant. In other embodiments, in which power packages in silicon technology are implemented, a phase change in a range between 50° C. and 250° C., in particular in a range between 50° C. and 150° C., may be relevant. In still other embodiments, for instance semiconductor sensors, even operation temperatures of down to −100° C. are possible. Depending on the application, phase change materials with very different phase change temperatures may be implemented.

In an embodiment, the phase change material has a thickness of less than 5 μm, in particular of less than 1.5 μm, more particularly of less than 1 μm. More generally, the thickness of the phase change material can be very small due to the energy sink at the phase transition. The mentioned small thicknesses of layers of phase change material (for instance constituting or forming part of the metallization of an electronic chip) on the one hand prevent an undesired increase of mechanical stress due to very thick metallization, which is highly advantageous and at the same time critical in particular for very small semiconductor dies (for instance having a thickness below 50 μm). Simultaneously and synergistically, such small thicknesses are sufficient for nevertheless reliably removing heat and stabilizing temperature of the electronic chip, even under the harsh conditions of power semiconductor technology.

However, in other embodiments, the phase change material may have other thicknesses than mentioned in the previous paragraph.

In an embodiment, the phase change material is configured for undergoing a solid/solid phase transition. In other words, the phase change material may be solid in all the different magnetic phases. Thus, it can be reliably prevented that a liquid or gaseous phase separates from a remaining solid portion of the electronic component upon phase change. When the phase change material remains solid in both phases, the entire electronic component always remains an integral body. It can then also be prevented that non-solid phase change material flow into undesired regions. A significant advantage of an embodiment implementing one or more such materials is that they stay in the solid phase during the phase transition, which allows for easy integration in semiconductor products (such as electronic chips or packages).

A group of magnetic phase change materials undergoing a solid/solid phase transition with the associated absorption and release of large amounts of heat are particularly preferred. These materials change their magnetic structure at a fixed and well-defined temperature, and the transformation can involve significant latent heat. Such materials are useful because they do not require nucleation to prevent supercooling. Additionally, when there is a solid/solid phase change, there is no visible change in the appearance of the phase change material, and there are no problems associated with handling liquids, i.e. containment, potential leakage, etc. In FEOL and/or BEOL, phase change with interiors may be implemented as one or more temperature stabilizing regions.

In an embodiment, the electronic component is configured as a naked die (i.e. a bare semiconductor piece) with surface metallization. The naked die may therefore have an integral overheating protection in form of the phase change material. For instance, the phase change material forms at least part of the surface metallization. In addition to its effect of delaying or decelerating a temperature increase until the phase change is completed, the exterior phase change material may then also fulfill an additional function, for instance an external electric contract and/or a heatsink being thermally coupled with an environment of the electronic component.

In another embodiment, the electronic component is configured as an encapsulated package. The electronic chip may then be at least partially encapsulated by an encapsulant. In an embodiment, the encapsulant is selected from a group consisting of a mold compound, and a laminate. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant.

In an embodiment, the phase change material is arranged at least partially within the encapsulant of the encapsulated package. Although an encapsulant may have advantageous effects in terms of mechanically protecting the electronic chip and electrically decoupling the electronic chip with regard to the environment, its heat removal capability may be only small to moderate. By equipping an interior of such a package (in particular an interior of such an encapsulant) with one or more phase change material structures, each of these phase change material structures may consume and dissipate heat at elevated temperature and may therefore contribute to a desired delaying or deceleration of a temperature increase at the phase change temperature.

In an embodiment, the electronic component comprises an at least partially electrically conductive connection element by which the electronic chip is connected. The electronic component may also comprise an encapsulant encapsulating at least part of the connection element and the electronic chip. In particular, such a connection element may comprise a chip carrier and/or a clip.

In the context of the present application, the term "chip carrier" may particularly denote an electrically conductive structure which serves as a mounting base for the one or more chips, and which may also contribute to the electric interconnection between chips. In other words, the chip carrier may fulfill a mechanical support function and an electric connection function. In the context of the present application, the term "leadframe" may particularly denote a preferred example of a chip carrier being configured as a sheet-like metallic structure which can be punched or patterned so as to form leadframe bodies as mounting sections for mounting the chip(s), and connection leads as pin sections for electric connection of the package to an electronic environment when the chips are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of the chips can be combined with a robust support capability of the leadframe. Furthermore, a leadframe may contribute to the thermal conductivity of the package and may remove heat generated during operation of the chips as a result of the high thermal conductivity of the metallic (in particular copper) material of the leadframe. Such a chip carrier may comprise at least one of the group consisting of a leadframe, a Direct Copper Bonding (DCB) substrate, and a Direct Aluminum Bonding (DAB) substrate. A leadframe may be preferred when simplicity is required. A DCB or DAB substrate has the advantage of a pronounced heat dissipation while electrically insulating an interior of the package with regard to an exterior thereof due to an electrically insulating and thermally conductive layer (for instance ceramic layer) between the two opposing electrically conductive layers (made of copper or aluminum).

In the context of the present application, the term "clip" may particularly denote a three-dimensionally curved connection element which comprises an electrically conductive material and is an integral body with sections to be connected to chip terminals and/or the chip carrier.

In an embodiment, the phase change material forms at least part of the one or more connection elements (in particular chip carrier and/or clip). For instance, the chip carrier (in particular leadframe) or clip may comprise a coating of the magnetic phase change material on a core (for instance made of copper). Magnetic phase change materials may be precisely applied by sputtering and properly adhere to base materials such as copper. Alternatively, the chip carrier or clip may consist of bulky magnetic phase change material.

In an embodiment, the electronic component comprises a heat dissipation body attached to form at least part of an exterior surface of the electronic component. Such a heat dissipation body (like a heat sink with cooling fins) may remove heat from the electronic component by heat conduction and/or heat convection. Advantageously, the phase change material may form at least part of the heat dissipation body. When the heat dissipation body heats up to an elevated temperature during fulfilling its function, exceeding the phase transition temperature will additionally consume thermal energy for phase change in a synergetic way.

In an embodiment, the magnetic phase change material is configured for consuming further energy when changing to a further magnetic phase in response to further heating up to or above a further (or second) phase change temperature above the previously mentioned (or first) phase change temperature. Since the phase change material is thermally coupled with the electronic chip, further heat will be dissipated from the electronic chip upon heating up to or above the further phase change temperature. Thus, a phase change material may be used which shows multiple magnetic phase transitions upon heating, wherein each of these phase transitions triggered by continued temperature increase consumes energy. For instance, such magnetic phase change material may be embodied by an appropriate alloy (concerning the example of an Fe—Co alloy, reference is made to FIG. 9). By taking this measure, two or more different temperature increase deceleration effects may be obtained at different temperature levels. This further improves the temperature stabilization or overheat protection of the electronic chip.

In an embodiment, the electronic component comprises a mounting base, in particular a printed circuit board (PCB), on which the (in particular non-encapsulated or encapsulated) electronic chip is mounted (for instance by soldering, sintering or gluing). Also in such an architecture, the provision of cooling or heat dissipating phase change materials may be advantageously implemented as a thermal stabilization feature.

In a preferred embodiment, the phase change material is configured for increasing its heat capacity when changing phase in response to heating up to or above the phase change temperature. When the value of the heat capacity is higher above the phase change temperature than below the phase change temperature, the event of exceeding the phase change temperature by the magnetic phase change material may—in addition to the consumption of latent heat—also increase the heat capacity. As a result, in the undesired event of a further heating of the electronic chip above the phase change temperature due to excessive thermal energy, heating the phase change material further will require and consume an increased additional amount of heat. This may at least reduce heating of the electronic chip and may therefore implement a further heat limiting feature.

In an embodiment, the method comprises supplying the energy consumed by the phase change material (when changing phase) at least partially from ohmic heat dissipated by a semiconductor chip during operation thereof. For instance, a current flow through the electronic chip and/or any other electronic member of the electronic component may generate ohmic losses which will increase the temperature in the environment of the flowing current. This will heat the environment of the flowing current, including the phase change material. When the phase change temperature is exceeded, the phase change material will absorb the energy required for the phase change from its environment and will at least partially consume and thereby dissipate the ohmic losses. Thus, a self-sufficient overheat protection can be integrated in an electronic system suffering from heat load due to ohmic losses.

In an embodiment, the method comprises using the phase change material for switching with high thermal load and low switching frequency. More specifically, the method may comprise using the phase change material for switching between different power sources. In such kind of applications, the described advantages of exemplary embodiments are particularly pronounced.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin Small Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient. In an embodiment, the electronic component is configured as power module, for instance molded power module. For instance, an exemplary embodiment of the electronic component may be an intelligent power module (IPM). Another exemplary embodiment of the electronic component is a dual inline package (dip).

In an embodiment, the electronic component is adapted for double-sided cooling. For this purpose, magnetic phase change material may be provided on both opposing main surfaces of the electronic component.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments. The illustration in the drawings are schematic and not to scale. In the drawings.

DETAILED DESCRIPTION

Figure 1:
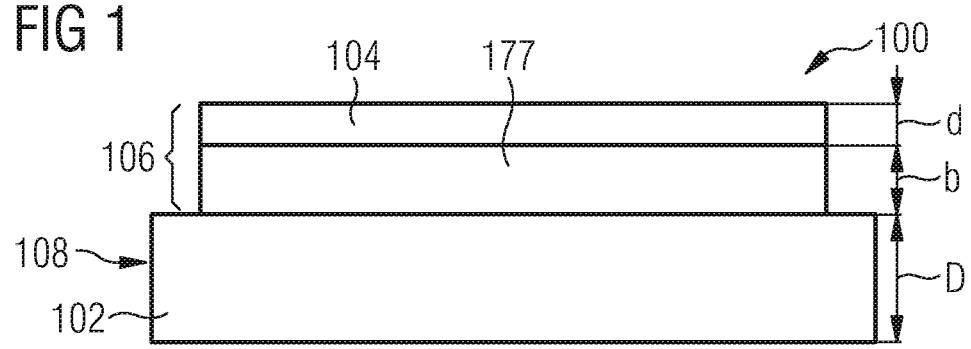
FIG. 1 illustrates a cross-sectional view of an electronic component according to an exemplary embodiment, which may be surface mounted on a mounting base or which may be encapsulated by an encapsulant.

Before exemplary embodiments will be described in more detail referring to the figures, some general considerations will be summarized based on which exemplary embodiments have been developed.

After the FEOL processing of power semiconductors, the processed wafers are getting front side and back side metallizations for electrical contacting. These metallization layers comprise typically stacks of individual metal layers which serve both for good ohmic contact to the silicon and a good heat sink for removing the heat load from the electrically active thin semiconducting layer during operation of the device. For very thin power semiconductors, in particular having a thickness of less than 80 µm, more particularly less than 50 µm (for instance with 40 µm silicon thickness), the thickness of the metal contacts has to be increased in order to provide a sufficient heat sink.

Conventional metal stacks comprise metal layers like for example Ti/Cu seed layer and Cu layers with thicknesses up to 10 µm for both front side and back side. For thinner silicon layers the copper thicknesses have to be increased up to 15 µm to 20 µm in order to increase the heat sink to protect the electrically active thin silicon. However, these thick copper layers lead to increased layer stress in the wafers which results in high wafer bow (for instance 1 mm or more) and chip bow, making both the wafer handling in front end and the die attach in back end very difficult, if not impossible.

Conventional processes for front side and back side metallizations involve metals with for example cubic face centered crystallographic symmetry and heat capacity resulting from their symmetry. Any increase of heat capacity is only possible with increase of metal layer thickness which results in both higher manufacturing costs and increase of layer stresses. Also higher wafer and chip bow occurs, which makes the manufacturability very difficult or even impossible. However, the absolute amount of heat which can be dissipated in a certain time frame is limited by the conductive area and heat resistance of the front side metal or back side metal.

Heat pipes may be implemented for promoting heat dissipation, but render the device large and complex.

Peltier elements have the disadvantage to consume an additional amount of energy and will make the power semiconductor device too large to fit into standard packages.

For improving the heat dissipation and for increasing the heat capacity of an electronic component, an exemplary embodiment provides an electrically conductive layer (or other electrically conductive structure) made by a material which exhibits a magnetic phase transition at a certain transition temperature leading to an additional contribution to the heat capacity and consuming energy during magnetic phase transition. Such a magnetic phase change material can be a material with magnetic phase transition at a certain temperature which comprises a change of magnetic ordering. For example, the alloy CuMnAs has a phase transition at about 325 K (i.e. about 50° C. to 60° C.). This metal alloy has an antiferromagnetic ordering below this phase change temperature and no magnetic ordering above the phase change temperature. The destruction of the antiferromagnetic order consumes a certain amount of heat, is reversible and has no critical influence on the crystallographic structure of the alloy. A main advantage of such a concept is the short time scale on which the melt-down of the antiferromagnetic order takes place (typically in the range of a few nano seconds). Hence, such a magnetic phase transition takes place much faster than for example structural phase transitions (like for example melting of solids or evaporation of liquids). Thus, the magnetic phase change will not affect the dynamic parameters of the electronic chip or integrated circuit elements thereof (for instance power transistor), for example power switching properties.

For many applications, it is preferred that the phase change temperature is in a range between 50° C. and 250° C., i.e. typical operation temperatures of an electronic component. By ensuring that the phase change temperature or phase transition does not occur at a too high transition temperature, it can be ensured that the cooling effect occurs in typically operation temperature ranges of electronic components. In addition, the feedback of the magnetic phase change material to the electrical current through the metallization should not influence strongly the current/voltage curve preventing a degradation of the electrical performance of a power semiconductor device during operation.

By configuring the phase change material to perform a solid-solid phase change, a solid-liquid phase transition may be prevented, thereby avoiding density anomaly (i.e. higher density in liquid state compared to the solid state) which may introduce a significant stress in the material.

Figure 5:
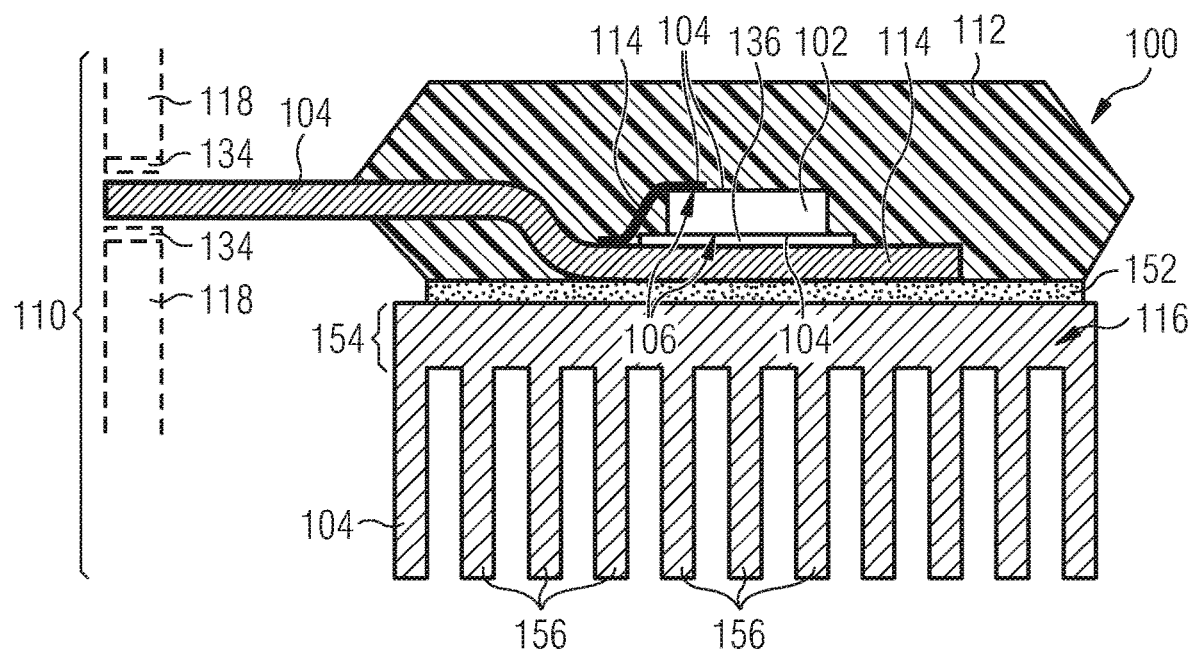
FIG. 5 illustrates a cross-sectional view of an electronic component configured as an encapsulated electronic chip on a chip carrier according to an exemplary embodiment.
Figure 6:
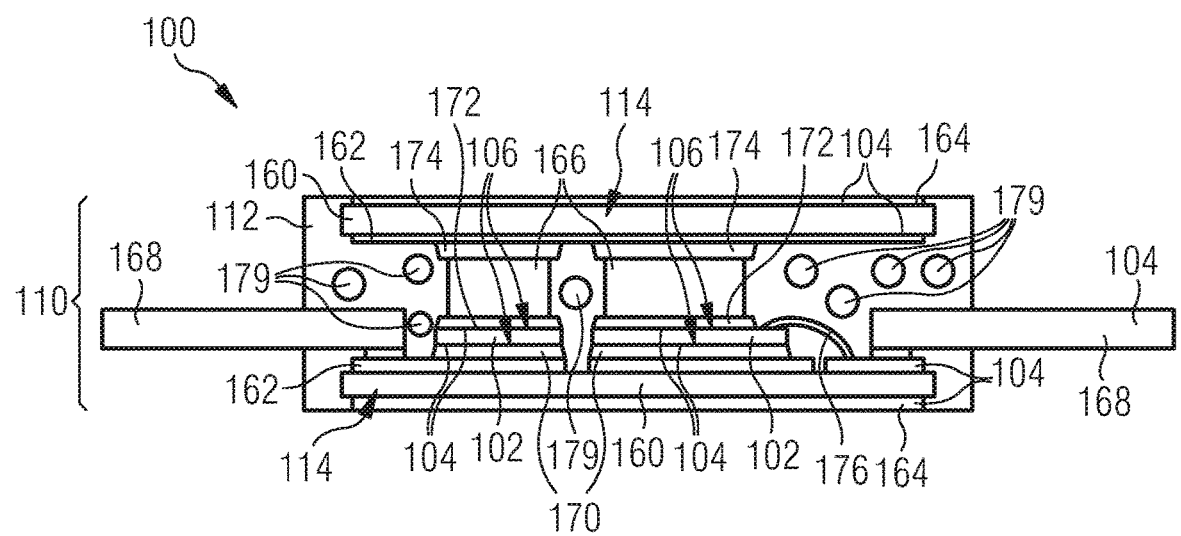
FIG. 6 illustrates a cross-sectional view of an electronic component configured as an encapsulated electronic chip with double-sided cooling according to an exemplary embodiment.

FIG. 1 illustrates (schematically and not true to scale) a cross-sectional view of an electronic component 100 according to an exemplary embodiment, which may for instance be surface mounted on a mounting base (see reference numeral 118 in FIG. 5 and FIG. 8) or which may be encapsulated by an encapsulant (see reference numeral 112 in FIG. 5 and FIG. 6).

The electronic component 100 comprises an electronic chip 102 which may be embodied for example as a power semiconductor chip. A magnetic phase change material 104 is arranged as temporary heatsink (i.e. a heatsink functioning particularly pronounced during phase transitions) and is configured for consuming energy when changing a magnetic phase or a magnetic ordering state in response to heating above a phase change temperature. Descriptively speaking, heat is not predominantly transported away from the temporary heatsink-type phase change material 104 during magnetic phase transition, but used to "melt" or destroy the magnetic order in order to change the magnetic phase state. As a result, a certain amount of heat is very quickly consumed in the event of a phase change and can be used for dissipating heat from the environment of the phase change material 104, in particular from the electronic chip 102 on which the phase change material 104 is mounted. In other words, the phase change material 104 is thermally coupled with the electronic chip 102 to thereby dissipate heat of the electronic chip 102 upon heating up to or above the phase change temperature.

In the shown embodiment, the phase change material 104 is an electrically conductive magnetic phase change material 104 configured for changing between different magnetic phases depending on temperature. More specifically, a thermally induced switching between an antiferromagnetic phase (below the phase transition temperature) and a paramagnetic phase (above the phase transition temperature) may be carried out. A preferred material for the phase change material 104 is a CuMnAs alloy.

In addition, the electrically conductive property of the phase change material 104 makes it possible that the latter is simultaneously used for conducting an electric signal, for example is configured as an electrical contact (for instance as a chip pad) of the electronic chip 102. As shown in FIG. 1, the phase change material 104 extends from the electronic chip 102 up to an exterior surface of the electronic component 100 and is therefore exposed for being electrically coupled with another electronic member (for instance by sintering or soldering or electrically conductively gluing).

Highly advantageously, the phase change material 104 is solid in the two magnetic phases above and below the phase transition temperature so that no issues with non-solid material of the electronic component 104 occurs according to FIG. 1, for instance handling issues with liquid material. Hence, the phase change material 104 is advantageously configured for undergoing a solid/solid phase magnetic transition.

It is also preferred that the phase change material 104 shows an increased heat capacity above the phase change temperature as compared to below the phase change temperature. This allows delaying or inhibiting unintentional excessive overheating of the electronic chip 102 above the phase change temperature, since the increased heat capacity consumes an increased amount of heat when being heated by a certain temperature difference above the phase change temperature as compared to below the phase change temperature. Thus, the increased heat capacity above the phase change temperature further improves the thermal performance of the electronic component 100 in addition to the positive effect of the latent heat consuming energy of the electronic chip 102 when reaching or exceeding the phase change temperature.

According to FIG. 1, the phase change material 104 forms a chip metallization 106 and may relate to a front end of the line (FEOL) metallization and/or a back end of the line (BEOL) chip metallization. The configuration of the electronic component 100 according to FIG. 1 shows the electronic chip 102 in form of a naked die 108 with surface metallization 106 so that the phase change material 104 here constitutes the surface metallization 106.

When the electronic component 100 is operated, current flows through the electronic chip 102 and the phase change material 104. As a result, ohmic heat is dissipated, so that in particular the electronic component 100 heats up. At a certain point of time, the phase change material 104 reaches its phase change temperature as a result of the heating and thereby changes its magnetic phase while advantageously remaining solid. Highly advantageously, the ohmic heat (which is to be dissipated from the electronic chip 102) contributes to the energy consumed by the phase change material 104 when undergoing the magnetic phase change. Consequently, the temperature of the electronic component 100 is stabilized by a self-sufficient phase change triggered heat consumption mechanism.

For instance, a thickness, D, of the electronic chip 102 may be 40 μm. A thickness, d, of the layer of magnetic phase change material 104 may be in a range between 0.5 μm and 0.8 μm. Such a magnetic phase change material 104 is on the one hand capable of dissipating sufficient thermal energy to prevent overheating and stabilize the temperature of the electronic chip 102. On the other hand, such a magnetic phase change material 104 may be provided thin enough to prevent mechanical stress of the electronic component 100. Such stress may arise from a thermal mismatch of the coefficient of thermal expansion between the semiconductor material of the electronic chip 102 as compared with the magnetic material of the phase change material 104. Furthermore, such a small thickness, d, makes it easily possible to apply the phase change material 104 by sputtering.

Optionally but preferably, an intermediate layer 177 may be sandwiched between the semiconductor material of the electronic chip 102 and the magnetic phase change material 104. For instance, the intermediate layer 177 (which may form part of the metallization 106) may act a seed layer promoting adhesion between the electronic chip 102 and the phase change material 104. For example, the intermediate layer 177 of thickness, b, may be a double layer (which may have an overall thickness below 1 μm) composed of a titanium layer in physical contact with the electronic chip 102 and a copper layer on the titanium layer and being in contact with the magnetic phase change material 104.

Figure 2:
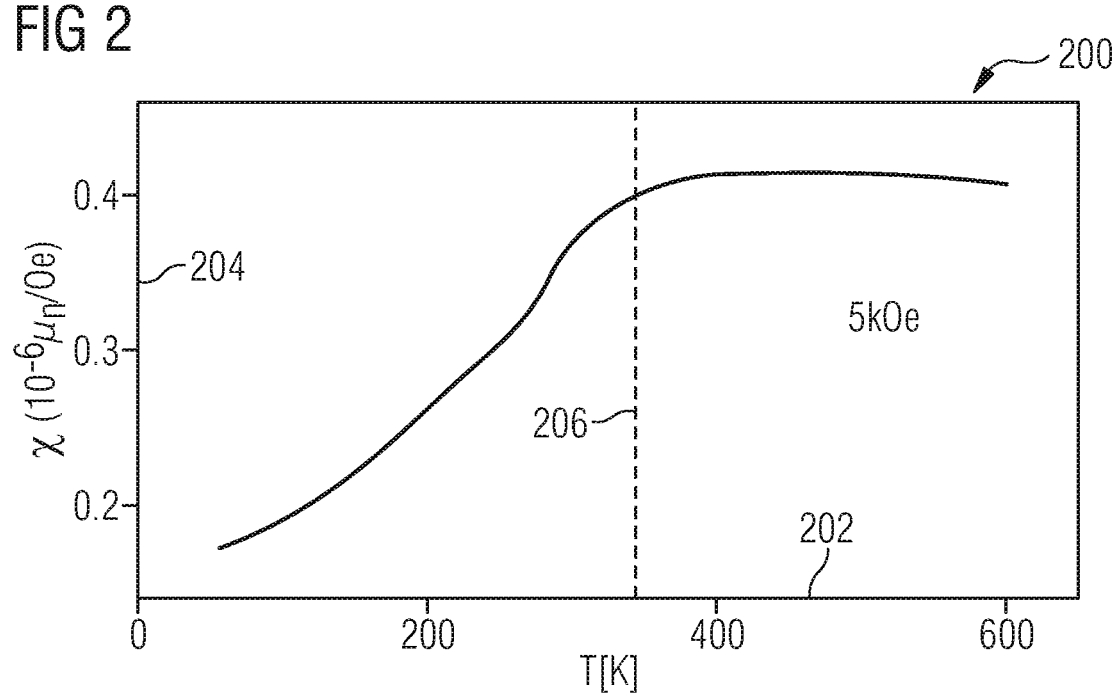
FIG. 2 is a diagram illustrating a dependence of magnetic susceptibility from temperature of a magnetic phase change material of an electronic component according to an exemplary embodiment.
Figure 3:
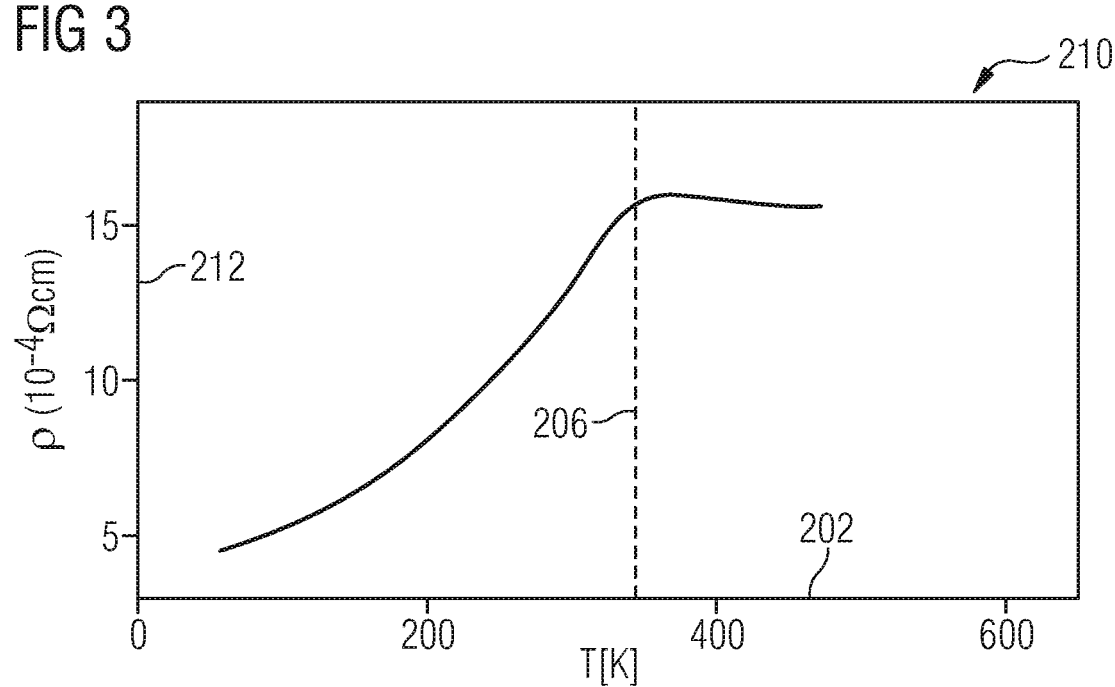
FIG. 3 is a diagram illustrating a dependence of electric resistivity from temperature of the phase change material of FIG. 2.
Figure 4:
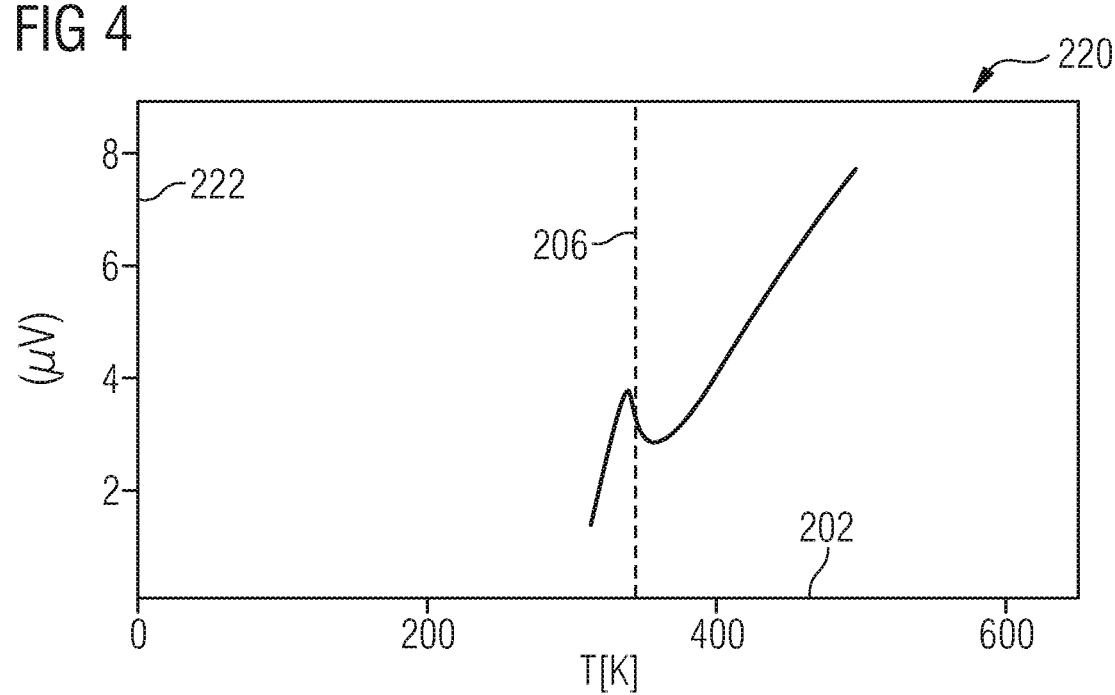
FIG. 4 is a diagram illustrating a dependence of a delay of temperature change from temperature of the phase change material of FIG. 2.

The advantageous properties of a preferred material for the phase change material 104, CuMnAs, in terms of exemplary embodiments will be explained in the following based on experimental evidence according to FIG. 2 to FIG. 4 (compare F. Maca et al., "Room-temperature antiferromagnetism of CuMnAs", Journal of Magnetism and Magnetic Materials, 324 (2012), pages 1606 to 1612):

FIG. 2 is a diagram 200 having an abscissa 202 along which the temperature is plotted in Kelvin. Along an ordinate 204, the magnetic susceptibility is plotted. Thus, FIG. 2 illustrates a dependence of the magnetic susceptibility from the temperature of the phase change material 104. A phase change temperature (approximately 325 K for the mentioned material) of the phase change material 104 is indicated with reference numeral 206 in FIG. 2. Only antiferromagnetic ordering occurs. FIG. 2 illustrates the response of the magnetic phase change material 104 on an external magnetic field. FIG. 3 is a diagram 210 having an abscissa 202 along which the temperature is plotted in Kelvin. Along an ordinate 212, the electric resistivity is plotted. As can be taken from FIG. 3, the metallic character of the phase change material 104 in terms of electric conductivity ensures both a good thermal transport and also allows conducting electric signals over the phase change material 104. FIG. 4 is a diagram 220 having an abscissa 202 along which the temperature is plotted in Kelvin. Along an ordinate 222, a parameter indicative of the delay of temperature of the phase change material 104 is plotted.

For the example material CuMnAs alloy as phase change material 104, the corresponding diagrams 200, 210, 220 are given: The diagram 200 shows the temperature dependence of the magnetic susceptibility, the diagram 210 illustrates the temperature dependence of the electrical resistivity, and the diagram 220 shows the delay of the temperature of the alloy CuMnAs while heating up (compared to a reference material without phase transition). The diagram 220 shows clearly an additional peak around the phase change temperature 206 indicating an additional heat consuming process inside the alloy which is advantageously used by exemplary embodiments.

A main advantage of the described phenomenon in terms of an exemplary embodiment is that the magnetic phase transition is only effecting the electrons at the Fermi edge and has nearly no effect on the lattice parameters of the alloy. Hence, neither a mechanical stress is produced, nor warpage of wafer or electronic chip 104 occurs.

FIG. 5 illustrates a cross-sectional view of an electronic component 100 configured as an encapsulated electronic chip 102 on a chip connection element 114 according to an exemplary embodiment. More specifically, FIG. 5 illustrates a cross-sectional view of an electronic component 100, which is embodied as a Transistor Outline (TO) package, according to an exemplary embodiment. The electronic component 100 is mounted on a mounting base 118, here embodied as printed circuit board (PCB).

The mounting base 118 comprises an electric contact 134 embodied as a plating in a through hole of the mounting base 118. When the electronic component 100 is mounted on the mounting base 118, electronic chip 102 of the electronic component 100 is electrically connected to the electric contact 134 via electrically conductive connection element 114, here embodied as a leadframe made of copper, of the electronic component 100.

The electronic chip 102 (which is here embodied as a power semiconductor chip) is mounted adhesively or soldered (by e.g. electrically conductive adhesive, solder paste, solder wire or diffusion soldering) on the connection element 114 (see reference numeral 136). An encapsulant 112 (here embodied as mold compound) encapsulates part of the leadframe-type connection element 114 and the electronic chip 102. As can be taken from FIG. 5, a pad on an upper main surface of the electronic chip 102 is electrically coupled to the partially encapsulated leadframe-type connection element 114 via a fully encapsulated clip-type further connection element 114.

During operation of the power package or electronic component 100, the power semiconductor chip in form of the electronic chip 102 generates a considerable amount of heat. At the same time, it shall be ensured that any undesired current flow between a bottom surface of the electronic component 100 and an environment is reliably avoided.

For ensuring electrical insulation of the electronic chip 102 and removing heat from an interior of the electronic chip 102 towards an environment, an electrically insulating and thermally conductive interface structure 152 is provided which covers an exposed surface portion of the leadframe-type connection element 114 and a connected surface portion of the encapsulant 112 at the bottom of the electronic component 100. The electrically insulating property of the interface structure 152 prevents undesired current flow even in the presence of high voltages between an interior and an exterior of the electronic component 100. The thermally conductive property of the interface structure 152 promotes a removal of heat from the electronic chip 102, via the electrically conductive leadframe-type connection element 114, through the interface structure 152 and towards a heat dissipation body 116. The heat dissipation body 116, which may be made of a highly thermally conductive material such as copper or aluminum, has a base body 154 directly connected to the interface structure 152 and has a plurality of cooling fins 156 extending from the base body 154 and in parallel to one another so as to remove the heat towards the environment.

One or more constituents of encapsulated package 110 may be provided with a magnetic phase change material 104 for heat dissipation or temperature stabilization. For instance, the phase change material 104 may form part of one or both of the connection elements 114, for instance may be a coating on a copper body. More specifically, the only partially encapsulated connection element 114 functioning as chip carrier may comprise (or alternatively consist of) magnetic phase change material 104, and/or the fully encapsulated connection element 114 functioning as clip may comprise (or alternatively consist of) magnetic phase change material 104. Additionally or alternatively, the die attach material (e.g. electrically conductive adhesive, solder paste/wire or metal stack for diffusion soldering on the chip backside) by which the electronic chip 102 is mounted on the chip connection element 114 may comprise a phase change material 104, for instance phase change material particles in an adhesive matrix. Also, a metallization of the electronic chip 102 may comprise or consist of a phase change material 104 (not shown in detail). Furthermore, the heat dissipation body 116 attached to the thermal interface material 152 to remove and spread heat may comprise a phase change material 104, for instance in form of a coated surface layer.

In the event of excessive heating of one or more of the mentioned constituents of the electronic component 120 shown in FIG. 5 heating one or more of the phase change materials 104 up to or above the phase change temperature 206 will trigger the respective phase change material 104 to dissipate heat from the electronic chip 102 by consuming thermal energy for being capable of performing the magnetic phase change.

FIG. 6 illustrates a cross-sectional view of an electronic component 100 configured as an encapsulated electronic chip 102 with double-sided cooling according to another exemplary embodiment.

The package according to FIG. 6 comprises two electronic chips 102 which are here embodied as power semiconductor chips. The electronic chip 102 shown on the left hand side of FIG. 6 may be a diode chip, whereas the electronic chip 102 shown on the right-hand side of FIG. 6 may be an IGBT (Insulated Gate Bipolar Transistor) chip.

A first heat removal body or first connection element 114, which is here embodied as Direct Copper Bonding (DCB) substrate, is thermally and mechanically coupled to a first main surface of the electronic chips 102 and forms part of an exterior surface of the package 100. The first connection element 114 is configured for removing thermal energy from the electronic chips 102 during operation of the package or electronic component 100 to a package external cooling body and/or cooling fluid (not shown). The first connection element 114 comprises a central electrically insulating and thermally conductive layer 160, here made of ceramic material, having a first main surface covered by a first electrically conductive layer 162 and having an opposing second main surface covered by a second electrically conductive layer 164. The electronic chips 102 are mounted and soldered or sintered on the first connection element 114 and are electrically connected with the first electrically conductive layer 162 by bond wires 176. Hence, the first connection element 114 functions as a chip connection element and as a heat sink. The second electrically conductive layer 164 of the first connection element 114 forms part of an exterior surface of the package and thereby significantly contributes to the heat removal from the electronic chips 102 during operation of the package.

Optional electrically conductive and thermally conductive spacer bodies 166, which may be embodied as copper blocks, are soldered or sintered onto upper main surfaces of the electronic chips 102.

Moreover, a second connection element 114 is thermally coupled to a second main surface of the electronic chips 102 via the spacer bodies 166. Also, the second connection element 114 comprises a central electrically insulating and thermally conductive layer 160, which may be made of ceramic, having a first main surface covered by a first electrically conductive layer 162 and having an opposing second main surface covered by a second electrically conductive layer 164. The first electrically conductive layer 162 of the second connection element 114 is soldered or sintered or welded onto the spacer bodies 166. The second electrically conductive layer 164 of the second connection element 114 forms part of an exterior surface of the package and thereby significantly contributes to the heat removal from the electronic chips 102 during operation of the package. As a whole, the second connection element 114 is configured as a heat sink for removing thermal energy from the electronic chips 102.

An electrically conductive contact structure 168, here embodied as a leadframe, extends partially within and partially outside of the encapsulant 112 and is electrically coupled with the electronic chips 102 via a solder or sinter connection with the patterned first electrically conductive layer 162 of the first connection element 114 and via the bond wires 176.

The electronic chips 102 are mounted on the patterned first electrically conductive layer 162 of the first connection element 114 by a first interconnection 170. The spacer bodies 166 are mounted on the electronic chips 102 by a second interconnection 172. The first electrically conductive layer 162 of the second connection element 114 is mounted on the spacer bodies 166 and above the electronic chips 102 by third interconnection 174. Each of the first interconnection 170, the second interconnection 172 and the third interconnection 174 may be a solder structure or a sinter structure or may be formed by welding.

As indicated schematically in FIG. 6, one or more of the following constituents of the electronic component 100 may be provided with a phase change material 104: the electrically conductive contact structure 168; at least one of the first electrically conductive layers 162; at least one of the second electrically conductive layers 164; the first interconnection 170; the second interconnection 172; the third interconnection 174. A circuit designer is entirely free to equip any hot spot within electronic component 100 with magnetic phase change material 104 as a local self-sufficient cooling.

As can be taken from FIG. 6 as well, the electronic device 100 additionally comprises a plurality of inclusions 179 which may comprise magnetic phase change material 104 as well. For instance, the inclusions 179 may comprise a thermally stable shell (for instance made of polyimide or another appropriate polymer) filled with magnetic particles such as ferrofluids as magnetic phase change material 104. Such inclusions 179 may be added to a liquid mold used for producing the encapsulant 112. These inclusions 179 further improve the thermal performance of the electronic component 100.

Figure 7:
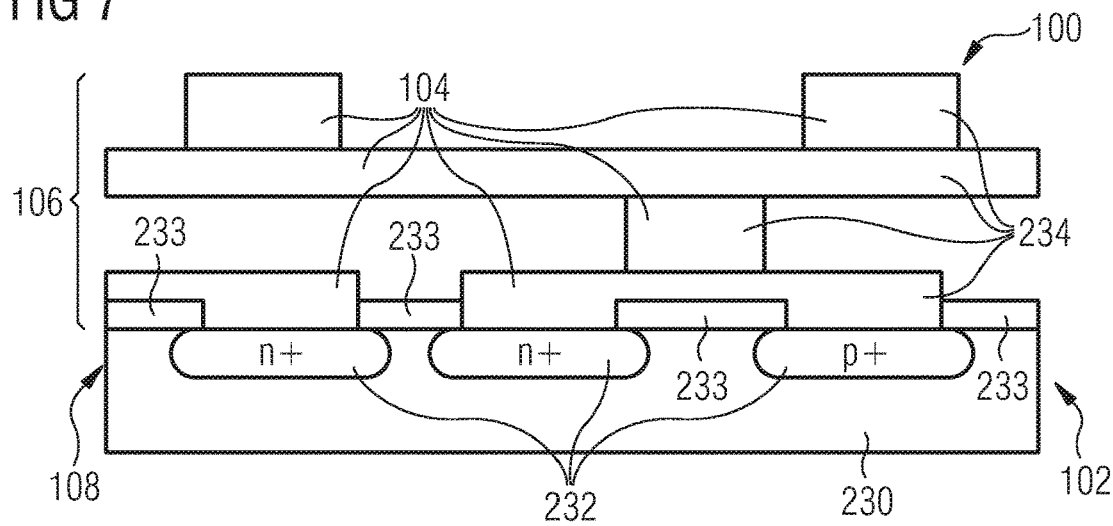
FIG. 7 illustrates a cross-sectional view of an electronic component configured as naked die with surface metallization according to an exemplary embodiment.

FIG. 7 illustrates a cross-sectional view of an electronic component 100 configured as naked die 108 with surface metallization 106 comprising a phase change material 104 according to an exemplary embodiment.

A semiconductor body 230 of electronic chip 102 has doped regions 232 and/or any other integrated circuit elements fulfilling a specific electronic function. A patterned dielectric layer 233 is applied on the semiconductor body 230 exposing the doped regions 232. A multilayer back end of the line (BEOL) wiring structure 234 electrically contacts the exposed doped regions 232. As indicated schematically in FIG. 7, any of the wiring structures 234 forming a surface metallization of the naked die 108 may be provided with phase change material 104 as local heat dissipating features for the electronic chip 102.

Figure 8:
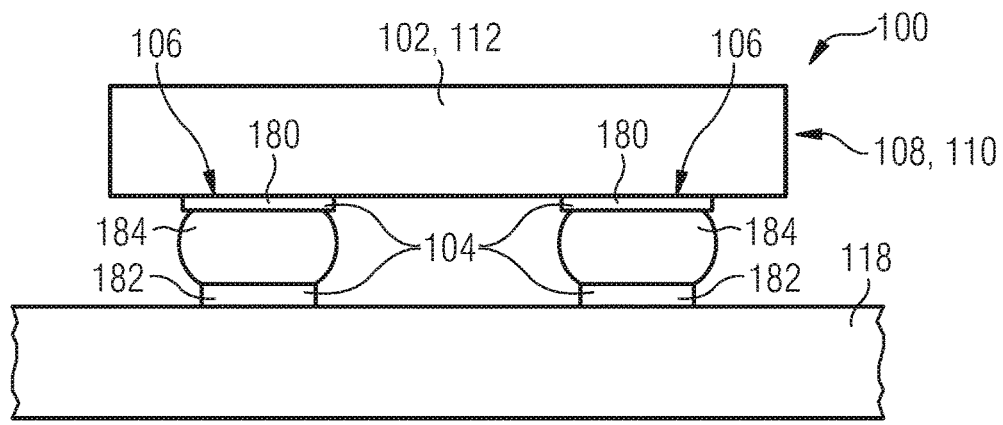
FIG. 8 illustrates a cross-sectional view of an electronic component composed of an encapsulated or non-encapsulated electronic chip on a mounting base according to an exemplary embodiment.

FIG. 8 illustrates a cross-sectional view of an electronic component 100 composed of an encapsulated or non-encapsulated electronic chip 102 on a mounting base 118 according to an exemplary embodiment.

The electronic component 100 comprises a naked electronic chip 102 having electrically conductive chip pads 180. Moreover, a mounting base 118 (such as a printed circuit board, PCB, or a leadframe) having pads 182 is foreseen on which the electronic chip 102 is connected, for instance using solder structures 184. FIG. 8 hence shows the coupling of an electronic chip 102 to mounting base 118, as a substrate, via pads 180 on the front side of the electronic chip 102.

In order to prevent overheating at an interface between the electronic chip 102 and the mounting base 118, it is for instance possible to configure at least one of the pads 180, 182 at least partially of phase change material 104.

Figure 9:
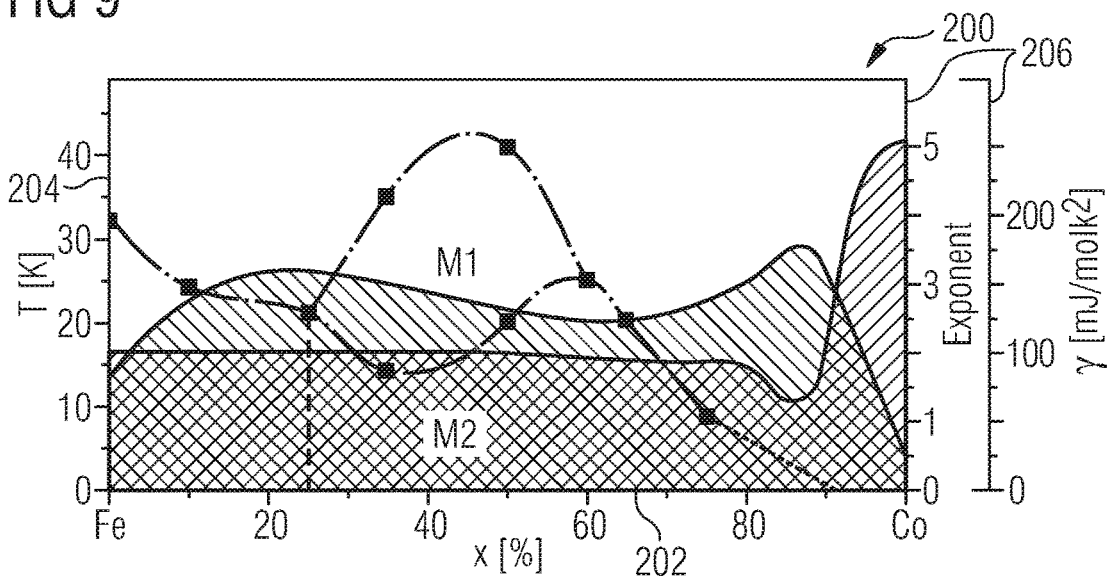
FIG. 9 is a diagram illustrating that, with certain alloys, phase change materials may be provided having more than two different magnetic ordering states at different temperature values.

FIG. 9 is a diagram 200 illustrating that, for instance in form of certain alloys (in the shown example a Fe—Co alloy), phase change materials 104 may be implemented in an electronic component 100 according to an exemplary embodiment, which phase change materials 104 have more than two (three in the shown embodiment) different magnetic ordering states at different temperatures. Consequently, such phase change materials 104 have at least two different phase changes at different temperature levels. When each of the corresponding at least two phase changes, triggered by continuous temperature increase of the phase change material 104, consumes energy, the implementation of such a phase change material 104 in an electronic component 100 according to an exemplary embodiment provides multiple temperature increase delay effects at different temperature levels. This additionally thermally stabilizes the electronic chip 102.

Now referring to diagram 200 in further detail, its abscissa 202 shows a ratio, X, of the alloy between iron and cobalt (on the left-hand side pure iron, on the right-hand side pure cobalt, in between varying ratio of iron and cobalt). Along a first ordinate 204, the temperature is plotted in Kelvin. Along a second ordinate 206, a parameter γ (the Sommerfeld Coefficient of the specific heat) is plotted in mJ/(mol K$^2$), as well as an exponent, α, of the electrical low temperature resistivity ρ as function of the temperature T (according to the equation $\rho(T)=\rho_0+A*T^\alpha$, with $\rho_0$ as residual resistivity at T=0K and A as constant). In a central range (approximately 35% to 60% cobalt), diagram 200 shows a magnetic low-temperature order state M2, followed by a high-temperature order state M1, wherein no magnetic order is present at still higher temperature values. Thus, the illustrated alloy shows two magnetic phase changes at different temperature levels.

Concerning the characteristic shown in FIG. 9 as such, reference is made to Bergmann, Christoph, Dissertation, Technical University Dresden, Max Planck Institute for chemical physics of solids Dresden, "SrCo2P2 and Lu(Fe1-x Cox)4Ge2: zwei Systeme mit ungewöhnlichem itineranten Magnetismus", 2015.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
   an electronic chip; and
   a magnetic phase change material thermally coupled with the electronic chip and configured to consume energy when changing between different magnetic phases in response to heating up to or above a phase change temperature and thereby dissipate heat from the electronic chip upon heating up to or above the phase change temperature.

2. The electronic component of claim 1, wherein the phase change material is selected from the group consisting of a Heusler compound, CuMnAs, CuMnSb, nickel, and a ferrofluid.

3. The electronic component of claim 1, wherein the phase change material is configured to change between two non-ferromagnetic phases.

4. The electronic component of claim 3, wherein the phase change material is configured to change between an antiferromagnetic phase and a paramagnetic phase.

5. The electronic component of claim 1, wherein the phase change material comprises an electrically conductive material.

6. The electronic component of claim 1, wherein the phase change temperature is in a range between −100° C. and 700° C.

7. The electronic component of claim 1, wherein the phase change material is configured so that a difference between a density of the phase change material in the different magnetic phases is less than 10%.

8. The electronic component of claim 1, wherein the phase change material is configured for undergoing a solid/solid phase transition.

9. The electronic component of claim 1, wherein the phase change material has a thickness of less than 5 μm.

10. The electronic component of claim 1, wherein the phase change material is configured to increase a heat capacity of the phase change material when changing phase in response to heating up to or above the phase change temperature.

11. The electronic component of claim 1, wherein the phase change material forms at least part of a chip metallization of the electronic chip.

12. The electronic component of claim 1, further comprising an intermediate layer between semiconductor material of the electronic chip and the phase change material.

13. The electronic component of claim 1, wherein the electronic chip is a semiconductor chip.

14. The electronic component of claim 1, wherein the electronic component is configured as a naked die with a surface metallization.

15. The electronic component of claim 14, wherein the phase change material forms at least part of the surface metallization.

16. The electronic component of claim 1, wherein the electronic component is configured as an encapsulated package.

17. The electronic component of claim 16, wherein the phase change material is arranged at least partially within an encapsulant of the encapsulated package.

18. The electronic component of claim 16, further comprising a heat dissipation body attached to form at least part of an exterior surface of the electronic component.

19. The electronic component of claim 18, wherein the phase change material forms at least part of the heat dissipation body.

20. The electronic component of claim 1, further comprising:

an at least partially electrically conductive connection element by which the electronic chip is connected; and
an encapsulant encapsulating at least part of the connection element and the electronic chip.

21. The electronic component of claim 20, wherein the phase change material forms at least part of the connection element.

22. The electronic component of claim 1, wherein the magnetic phase change material is configured to consume further energy when changing to a further magnetic phase in response to further heating up to or above a further phase change temperature above the phase change temperature, wherein the phase change material is thermally coupled with the electronic chip to thereby dissipate further heat from the electronic chip upon heating up to or above the further phase change temperature.

23. A method, comprising:

providing an electronic chip thermally coupled with a magnetic phase change material which is configured to consume energy when changing between different magnetic phases in response to heating up to or above a phase change temperature; and
operating the electronic chip and thereby generating heat which heats the phase change material up to or above the phase change temperature to thereby dissipate heat from the electronic chip by the phase change.

24. The method of claim 23, further comprising:

supplying energy consumed by the phase change material, when changing phase at least partially from ohmic heat dissipated by the electronic chip during operation of the electronic chip.

* * * * *